US005923092A

United States Patent [19]

Kang

[11] Patent Number: 5,923,092

[45] Date of Patent: Jul. 13, 1999

[54] WIRING BETWEEN SEMICONDUCTOR INTEGRATED CIRCUIT CHIP ELECTRODE PADS AND A SURROUNDING LEAD FRAME

[75] Inventor: Je Bong Kang, Asan, Rep. of Korea

[73] Assignee: Samsung Electronics, Co., Ltd., Suwon, Rep. of Korea

[21] Appl. No.: 08/773,679

[22] Filed: Dec. 24, 1996

[30] Foreign Application Priority Data

Jun. 13, 1996 [KR] Rep. of Korea ...................... 96/21244
Nov. 20, 1996 [KR] Rep. of Korea ...................... 96/55751

[51] Int. Cl.[6] ......................... H01L 23/495; H01L 23/04; H01L 23/48

[52] U.S. Cl. .......................... 257/786; 257/666; 257/695; 257/670

[58] Field of Search .................................... 257/695, 786, 257/784, 666, 776, 780, 690, 692, 694, 696, 672, 674, 670; 438/123

[56] References Cited

U.S. PATENT DOCUMENTS

| | | | |
|---|---|---|---|
| 4,999,700 | 3/1991 | Dunaway et al. | 257/666 |
| 5,270,570 | 12/1993 | Westerkamp | 257/666 |
| 5,327,008 | 7/1994 | Djennas et al. | 257/676 |
| 5,466,968 | 11/1995 | Okumura et al. | 257/693 |
| 5,637,913 | 6/1997 | Kajihara et al. | 257/666 |

FOREIGN PATENT DOCUMENTS

| | | | |
|---|---|---|---|
| 1-196138 | 8/1989 | Japan | 257/786 |
| 4-268749 | 9/1992 | Japan | 257/786 |
| 4-269856 | 9/1992 | Japan | 257/666 |
| 6-53266 | 2/1994 | Japan | 257/786 |

*Primary Examiner*—Mahshid Saadat
*Assistant Examiner*—Jhihan B. Clark
*Attorney, Agent, or Firm*—Marger Johnson & McCollom, P.C.

[57] ABSTRACT

A semiconductor IC device requiring dense arrangements of I/O connections in which a plurality of electrode pads are arranged in a rectangular form for a quad surface mounting type package, corner electrode pads are arranged to be shifted toward inside of a semiconductor chip for reducing the distance of corner bonding wires, or corner inner leads are bent and further extended toward the chip for making shorter the span length of the corner bonding wires, so that wire sweeping and electrical shorting of the corner bonding wires during a wire bonding and a molding processes can be prevented and the reliability of the bonding wires can be improved.

4 Claims, 7 Drawing Sheets

WIRING BETWEEN SEMICONDUCTOR INTEGRATED CIRCUIT CHIP ELECTRODE PADS AND A SURROUNDING LEAD FRAME

BACKGROUND OF THE INVENTION

1. Field of the Invention

The present invention relates to a semiconductor integrated circuit device. More particularly, the present invention is directed to semiconductor chip designs and structures of inner leads of a lead frame in IC devices requiring dense arrangements of input and output connections.

2. Description of the Related Arts

A semiconductor chip must have connectors such as electrode pads (also called 'bonding pads') for making electrical interconnections with an external world (e.g., lead frame leads). For these electrical interconnections, a wire bonding technology is widely used, by which electrode pads of the chip and the inner leads of a lead frame are coupled through metal wires, such as gold or aluminum bonding wires. Important parameters in the design of wire bonding structures include the maximum wire span, the electrode pad pitch, the lead pitch, and the arrangement of the electrode pads on a chip's active surface.

The maximum wire span (i.e., the maximum allowable distance between an electrode pad and an inner lead electrically coupled by a wire, without undue risk of short circuiting) is influenced, among other things, by the diameter of the bonding wire. The 100-D rule is generally applied to determine the maximum allowable wire span length. For example, if a wire has a diameter of 1.25 mil (=0.00125 in. or 32 micron), 125 mil of wire span is normally designed to be a maximum. The maximum wire span also depends on the distance between electrode pads and the edge of a lead frame pad (or die pad). One of the most important factors, however, in determining the maximum wire span is whether or not the bonding wires can endure the pressure of molding flow to prevent electrical shorts with neighboring wires. In the present semiconductor assembly industry, the maximum wire span is about from 180 to 200 mil, but it is desirable to have the wire span significantly shorter than this in order to avoid the above mentioned problems.

The electrode pad pitch is the distance between two adjacent electrode pads on the semiconductor chip along the electrode pad line, while the lead pitch is the distance between two inner leads of the lead frame. Both pitches are important in the bonding structure design. The required pad pitch and lead pitch are basically determined by how many electrical paths to the external device are needed in the IC device. The greater the number of the electrode pads (and therefore, also, inner leads), the finer the pad pitch and lead pitch need to be. The pad pitch also depends on other factors, such as; the size of the electrode pads, the size of a wire ball formed on the electrode pad, the distance between a capillary of a wire bonding head and neighboring wire ball, and the distance between the capillary and neighboring bonding wire. Presently, the minimum allowable pad pitch is about from 80 to 100 micron, and the minimum allowable lead pitch (determined in light of the manufacturable limits of the lead frame) is approximately 180 to 200 micron.

FIG. 1A shows a plan view of a lead frame suitable for use in packaging a semiconductor chip requiring high I/Os, according to the prior art, and FIG. 1B is an enlarged view of 'A' of FIG. 1A. Referring to FIGS. 1A and 1B, a semiconductor chip 10 is attached to a die pad 12 of the lead frame, and the die pad 12 is coupled to side rail 17 of the lead frame by four corner tie bars 14. The tie bars 14 are used to suspend the die pad 12. (The chip 10 and lead frame are symmetrical about both an imaginary x and y axis, intersecting in the center of chip 10, therefore each corner is of identical construction and reference to one corner can be considered a reference to any of the four corner segments.) Inner leads 16 of the lead frame are electrically connected to electrode pads 20 of the chip 10 by bonding wires 18. The inner leads 16 extend radially inward toward four sides of the chip 10. This type of lead frame is employed in conventional quad surface mount packages such as QFP (Quad Flat Package), PLCC (Plastic Leaded Chip Carrier), CLCC (Ceramic Leaded Chip Carrier), and the like. These quad packages can provide more than two hundred I/O connections, and have outer leads formed as a gull-wing or a J-shape for surface mounting that allows higher mounting density than a pin insertion mounting method. Furthermore, the inner leads 16 have an inner lead tip line 13 which is not parallel to the side of the chip 10, but is instead slightly tilted outward, away from chip 10, at the central side regions. By doing this, more inner leads can be included than in a comparable parallel inner lead structure.

The semiconductor chip 10 conventionally employed in the quad type package has a plurality of electrode pads 20 arranged along electrode pad lines 21 in a rectangular form along the periphery of the chip active surface in order to accommodate very dense arrangements of I/O connections. Unfortunately, in the quad surface mount package, corner wires for connecting electrode pads formed on corners of the chip and inner leads near the tie bars 14 inevitably have very long wire span. For example, with reference to FIGS. 1A and 1B, in an exemplary embodiment of the prior art, the size of the chip 10 is 4675 $\mu m^2$, the pad pitch is a constant 75 $\mu$m, and a 208 pin (or lead count) lead frame with lead pitch 'lp' of 200 $\mu$m is used. The resulting wire span S2 at the central region is 182 mil while the corner wire span S1 is 218 mil. These significantly longer corner wire may result in electrical shorting with neighboring corner wires during a wire bonding process or a molding process. In particular, the distance between the neighboring wires decreases toward the electrode pads, thus making electrical shorts more likely. In the above example, for instance, the resulting distance d1 is 97.6 $\mu$m and the resulting distance d2 is 136.5 $\mu$m, where d1 is taken at a position one-quarter of S1 from the electrode pads and d2 is taken at a position one-half of S1 away from the electrode pads.

Among the difficulties experienced by the prior art, is electrical short circuiting of nearby wires due to molding flow or wire sweep. The corner wires located on both sides of a gate G (through which a molten plastic is injected and flows perpendicularly past the long corner wires, see FIG. 1A) experience considerable force during molding, and thus, wire sweep and electrical shorting with adjacent wires tends to occur. In order to avoid this problem, another prior art semiconductor chip 10, as shown in FIG. 2, has an increased pad pitch of the corner electrode pads 22. With this structure, the distance between adjacent wires can be increased. For example, modifying the above exemplary chip and lead frame, when the corner pad pitch is increased to 120 $\mu$m (compared to 75 $\mu$m) the wire distances d3 and d4 (taken at the same locations along S1 as d1 and d2, respectively) are increased over d1 and d2 to 119.6 $\mu$m and 151.2 $\mu$m, respectively. However, a significant drawback of this prior art is that the increase of the corner pad pitch results in a larger chip size. This increase in chip size is obviously retrogressive against the miniaturization trend in the modern semiconductor industry, and thus undesirable.

Another example of the prior art is U.S. Pat. No. 5,466, 968 which discloses a lead frame in which inner leads are arranged to turn by 90 degrees from the typical arrangement shown in FIG. 1A. With this structure of the inner leads, the leads are progressively closer to an IC chip toward tie bars of a lead frame, which allows the corner wires near the tie bars to be shortened.

As the integration of IC devices becomes higher, the number of input and output connections required in the IC device increases significantly. In particular, the number of I/O connections for logic and microprocessor devices continues to increase in proportion to the number of gates on the IC chip. Accordingly, there is a need in the semiconductor industry to further and more effectively overcome the problems and disadvantages described above, particularly in connection with the corner wires.

SUMMARY OF THE INVENTION

An object of this invention, therefore, is to improve the reliability of the bonding wires in an IC device requiring dense arrangements of input and output connections ("I/Os").

Another object of this invention is to prevent electrical shorting failures between adjacent bonding wires, particularly, between those located in corner regions of a semiconductor chip which requires dense arrangements of I/Os.

Still another object of this invention is to provide even more I/Os within an IC device of the same size.

According to one aspect of the present invention, electrode pads of a semiconductor chip arranged in chip corner regions are shifted toward a central chip region from the normal rectangular layout of the prior art electrode pads, thus increasing the distance between adjacent bonding wires. In addition, the distance between adjacent bonding wires is further increased by increasing the pad pitch of the corner electrode pads.

According to another aspect of the present invention, a semiconductor IC device with a quad type lead frame having high lead counts is enabled, wherein corner inner leads of the lead frame are further extended toward the chip. With this structure, it is possible to make the corner bonding wires shorter, and thus increase the stability of the bonding wires against wire sweep and electrical shorting problems.

BRIEF DESCRIPTION OF THE DRAWINGS

While some of the objects and advantages of the present invention have already been stated, others will be more fully understood from the detailed description that follows by reference to the accompanying drawings in which:

Note: Because of the symmetrical arrangement of the semiconductor chip and lead frame, FIG. 1B is representive of each of the four corners of the FIG. 1A prior art embodiment.

Note: Because of the symmetrical arrangement of the semiconductor chip and lead frame, FIG. 2 is representive of each of the four corners of this prior art embodiment.

Note: Because of the symmetrical arrangement of the semiconductor chip and lead frame, FIGS. 3A and 3B are representive of each of the four corners of this preferred embodiment.

Note: Because of the symmetrical arrangement of the semiconductor chip and lead frame, FIGS. 4A and 4B are representive of each of the four corners of this preferred embodiment.

Note: Because of the symmetrical arrangement of the semiconductor chip and lead frame, this Figure is representive of each of the four corners of this prior art embodiment.

DETAILED DESCRIPTION OF THE PREFERRED EMBODIMENT

Figure 3A:
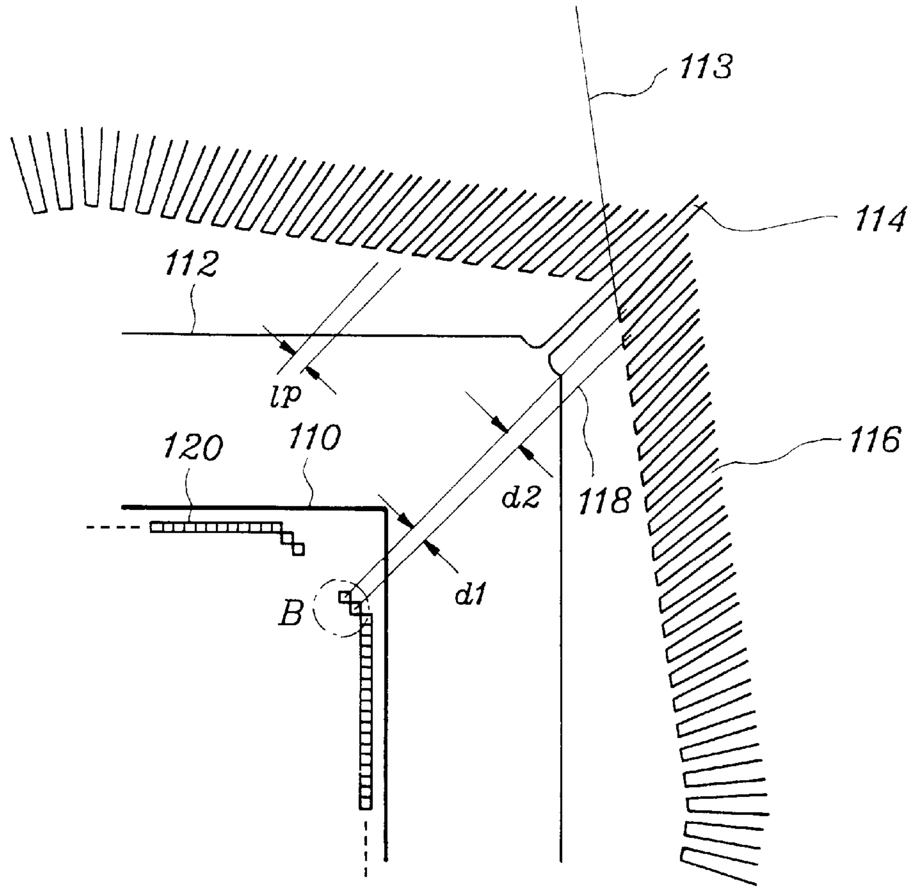
FIG. 3A is a partial plan view of a semiconductor IC device having high I/O connections, having a lead frame and a semiconductor chip having corner electrode pads shifted toward inside of the semiconductor chip according to a preferred embodiment of this invention.
Figure 3B:
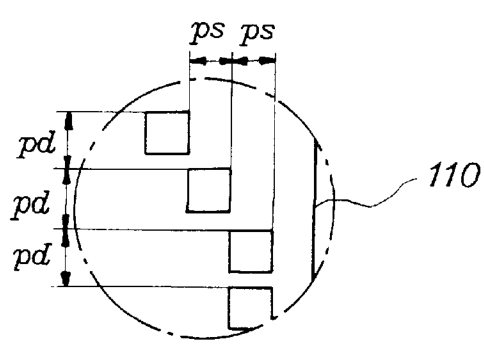
FIG. 3B is a detailed view of detail 'B' of FIG. 3A.

Referring to FIGS. 3A and 3B, a preferred embodiment of the present invention comprises a semiconductor chip 110 attached to and supported by a die pad 112. The die pad 112 is coupled to side rail regions (not shown) of a lead frame by tie bars 114. The tie bars 114 are positioned at four corners of the die pad 112 (only one corner shown). Inner lead frame leads 116 extend radially inwardly, toward four sides of the chip 110. The inner leads 116 are electrically connected to the electrode pads 120 by bonding wires 118.

An inner lead tip line 113 is not parallel to the corresponding side of the semiconductor chip, but instead, the center inner leads are further separated from the outside of the chip, which allows more leads to be provided. When the inner lead tip line 113 is designed further from the side of the chip, the number of inner leads 116 between tie bars 114 can be increased. Unfortunately, the extent of the spacing between the lead tip line 113 and the side of the chip 110 is still limited by the maximum wire span design rule.

The electrode pads 120, contrary to the prior art, have a non-orthogonal layout on an active surface of the chip 110. Instead, the corner electrode pads are arranged to be shifted toward the inside of the chip with a constant distance 'ps' between each subsequent pad, as shown in FIG. 3B. In this embodiment, the shifted corner electrode pads have the same pad pitch 'pd' as the other electrode pads.

With this arrangement of the electrode pads, it is possible to increase the distance between adjacent bonding wires in the chip corner region without increasing the chip size. For example, when applied to the previously discussed exemplary semiconductor chip and lead frame of the prior art (i.e. chip size of 4675 $\mu m^2$, and a 208 pin lead frame with lead pitch 'lp' of 200 μm) and with the corner pad shift 'ps' being a constant 70 μm; the resulting wire distances d1 and d2 are 130.8 μm and 160.2 μm (an increase over the prior art of 33.2 μm and 23.7 μm, respectively). As a result, the potential for electrical shorting of neighboring wires is significantly reduced, and therefore, more stable bonding wires are obtained.

Figure 4A:
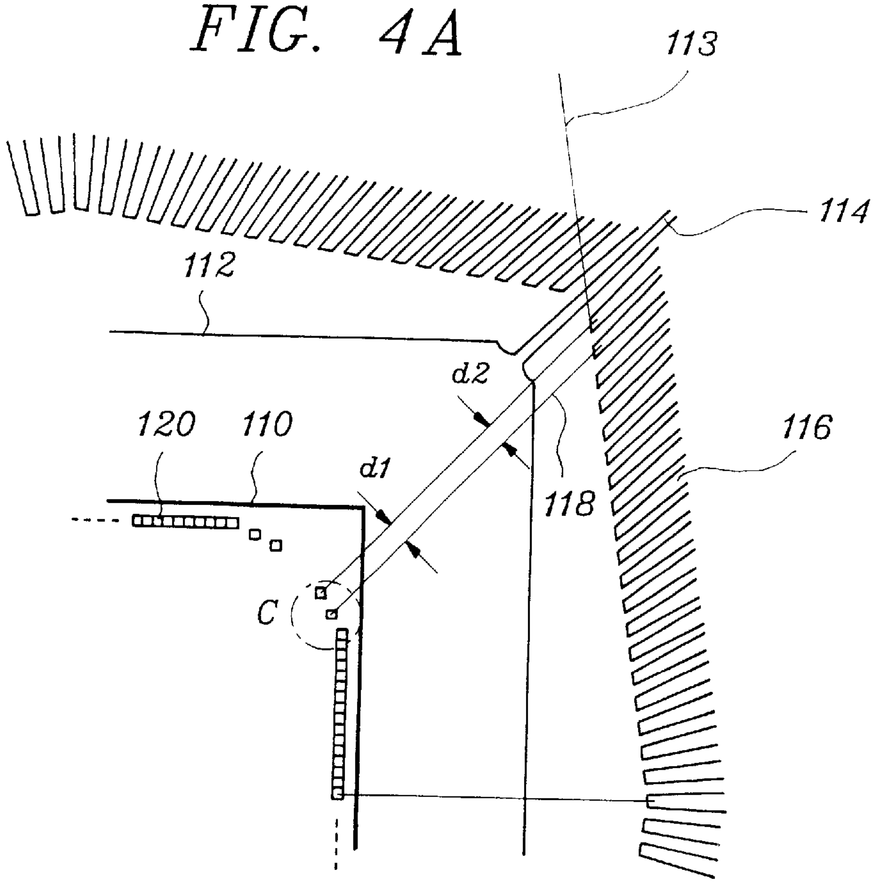
FIG. 4A is a partial plan view of a semiconductor IC device having high I/O connections, having a lead frame and a semiconductor chip in which corner electrode pads are shifted toward the inside of the chip and therefore have larger pad pitch according to another preferred embodiment of the present invention.
Figure 4B:
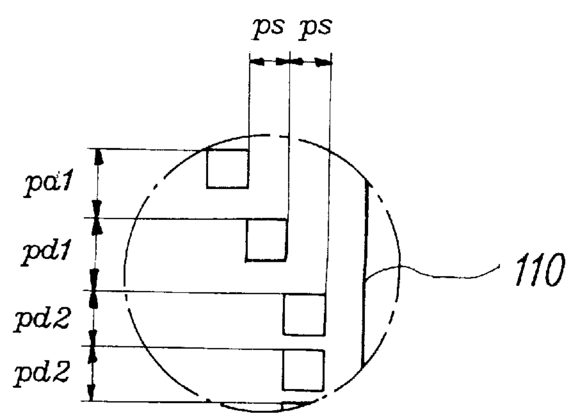
FIG. 4B is a detailed view of detail 'C' of FIG. 4A.

FIGS. 4A and 4B show another embodiment of the present invention. The electrode pad pitch is not uniform in this embodiment, instead the corner pads have larger pad pitch. With this arrangement, it is possible to increase the distance between the corner wires (i.e. d1 and d2), by shifting the corner pads less than the embodiment of FIG. 3. For example, if the pad shift 'ps' is only 35 μm and corner pad pitch 'pd1' is 120 μm (larger than the exemplary pad pitch 'pd2' of 75 μm), the resulting wire distances d1 and d2 become 141.7 μm and 166.2 μm; an increase over the prior art of 44.1 μm and 29.7 μm, respectively.

Figure 5:
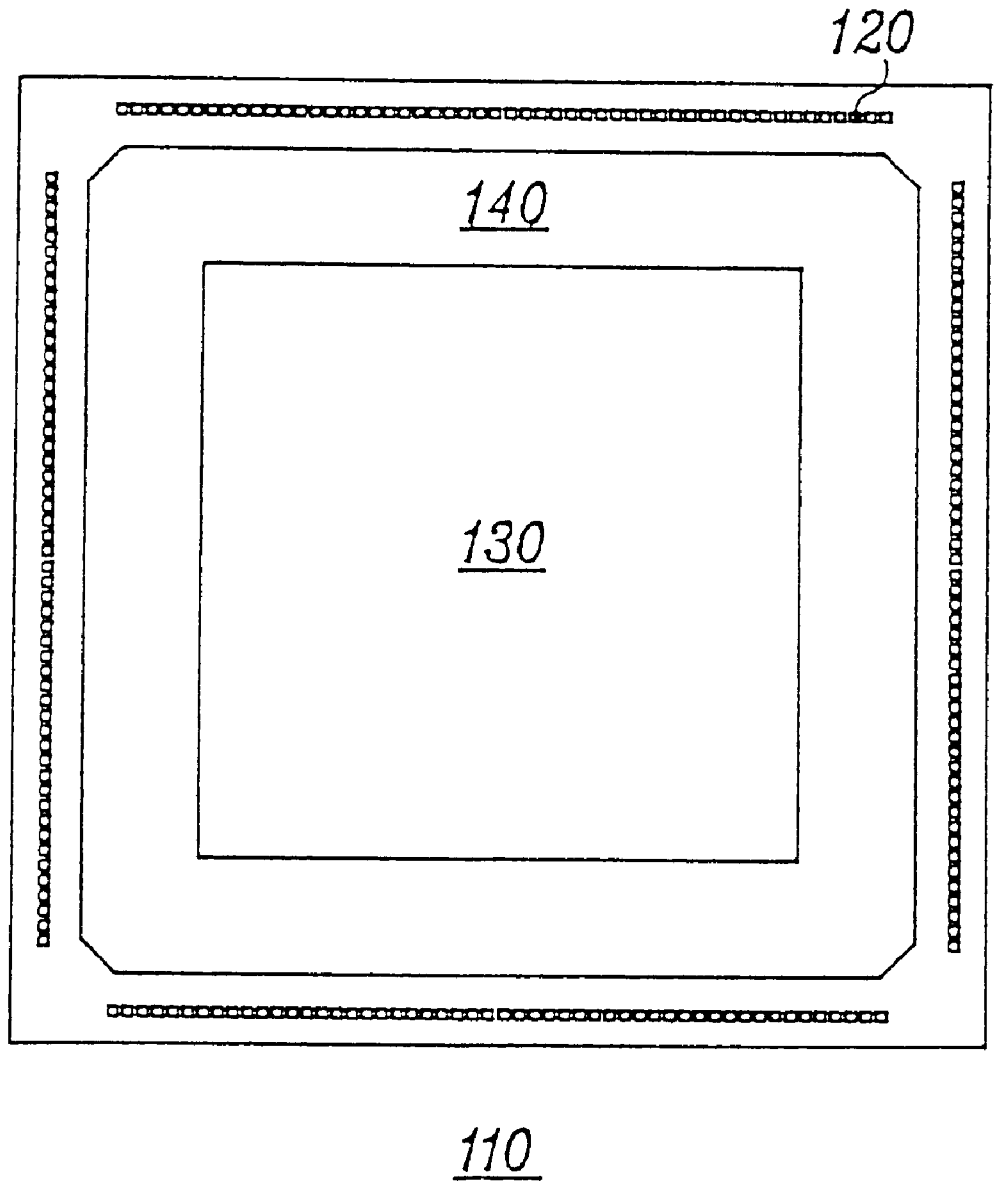
FIG. 5 is a plan view of a semiconductor chip.

Referring to FIG. 5, a semiconductor chip 110 has several features. Inside the semiconductor chip 110, where the corner electrode pads are to be shifted according to the present invention, active circuit patterns are formed in a central region 130. Among other things, control circuits for delivering positive and negative supply voltage signals to the active circuits and for electrically interconnecting the active circuits are formed in a peripheral region 140. Because the active device-size shrink technology has progressed more rapidly than the reduction of the electrode pad pitch, it is enough, for now, to provide a space for shifting the corner electrode pads within the semiconductor chip. To achieve high yields in the package assembly, design rules such as the electrode pad pitch and the shift of the corner pad pitch must be determined before the chip layout is started. In deciding upon the appropriate design for a particular application, both the space available for the corner pad shift and the limit that the corner pad pitch can increased should be considered. On the basis of these decisions, the appropriate embodiment of the present invention (i.e. FIG. 3 or FIG. 4) may be chosen.

Figure 6A:
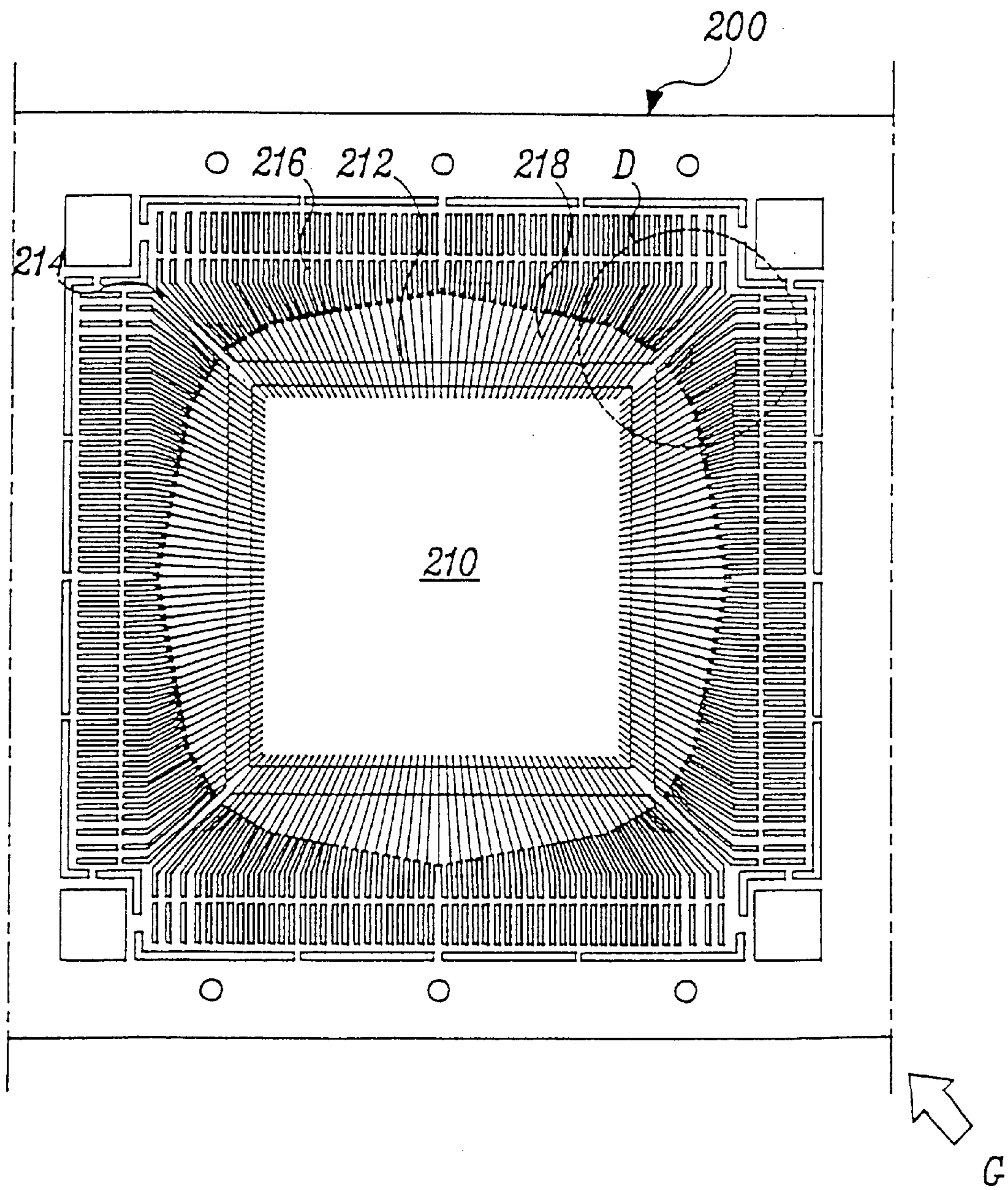
FIG. 6A is a plan view of a semiconductor IC device having high I/O connections, having a lead frame to which a semiconductor chip is attached, wherein corner inner leads are further extended toward the semiconductor chip and bent further away from the center of the chip side, according to another aspect of the present invention.
Figure 6B:
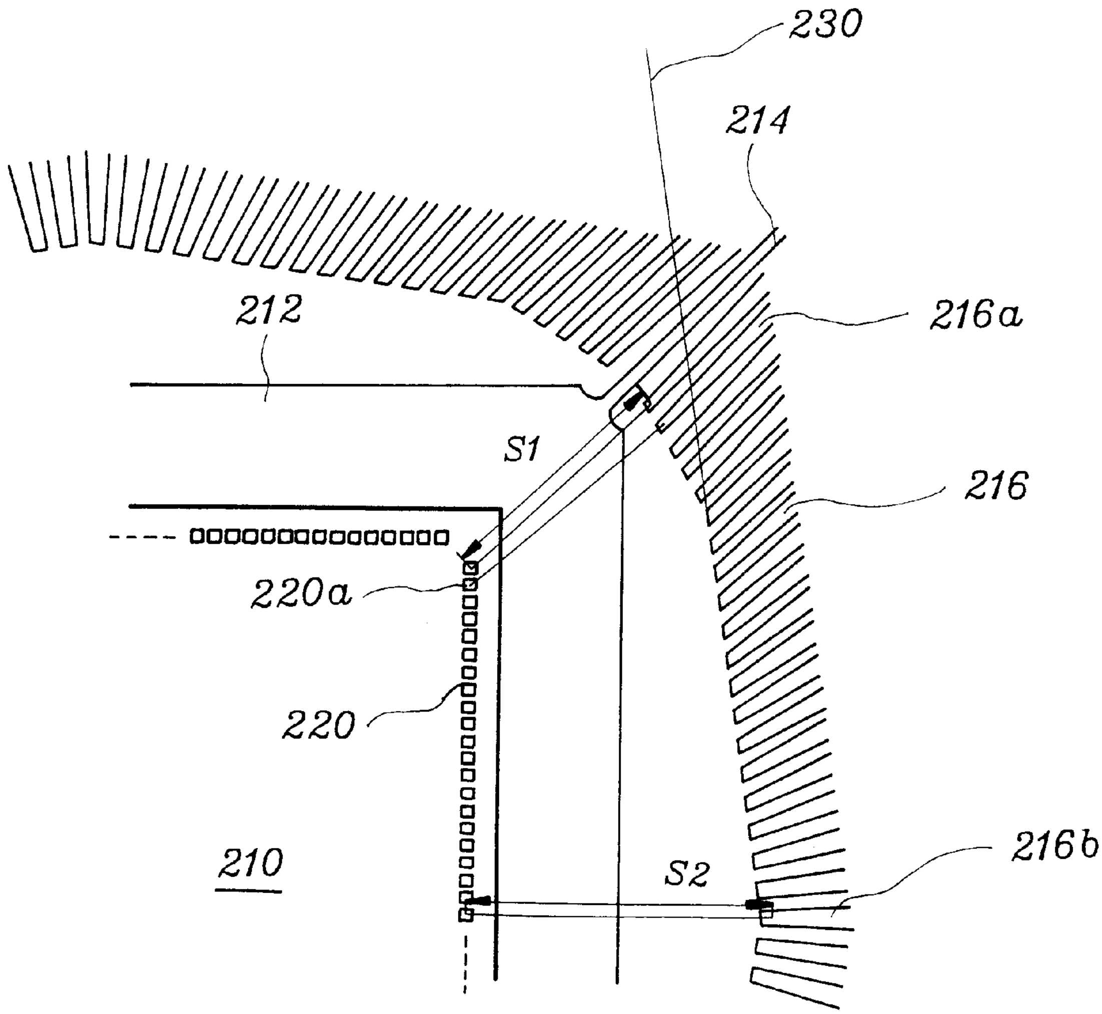
FIG. 6B is a detailed view of detail 'D' of FIG. 6A.

FIGS. 6A and 6B show still another embodiment of the present invention. Electrode pads 220 of a semiconductor chip 210 have a constant pad pitch, and corner pads 220*a* are arranged in the line along which the other electrode pads 220 are arranged. The inner leads extend radially inward toward, but spaced from, the die pad 212. The leads have their respective tips arranged on a line 230 which is slightly slanted from a line parallel to the corresponding side of the die pad 212. Inventively, as compared to inner leads 216, the corner inner leads 216*a* are further slanted toward the tie bar 214 as well as increasingly extended toward the semiconductor chip corner regions, as they approach the tie bar 214. It is preferable to make the extended portions of the corner inner leads 216*a* parallel to each other, in order to keep the distance between the corner bonding wires constant.

When this structure of lead frame is applied to the exemplary chip and lead frame, the wire span S2 of the center inner leads 216*b* is unchanged (182 mil), but wire span S1 of the corner inner leads 216*a* is reduced to 160 mil, which, significantly, saves 58 mil of wire span length, in comparison with the prior art structure. These shorter wire bonds not only reduce the probability of wire sweep during a molding procedure, they also lower the probability of electrically short circuiting two corner wires to each other or short circuiting a wire to an inappropriate lead. Accordingly, the reliability of the bonding wire is greatly improved.

Furthermore, because the corner wire span is shortened, the inner lead tip line can be kept at a farther distance from the side of the chip, thus allowing more inner leads to be provided with the same maximum span of the corner bonding wires. Accordingly, more I/O connections can be provided within the same-sized chip.

Figure 1A:
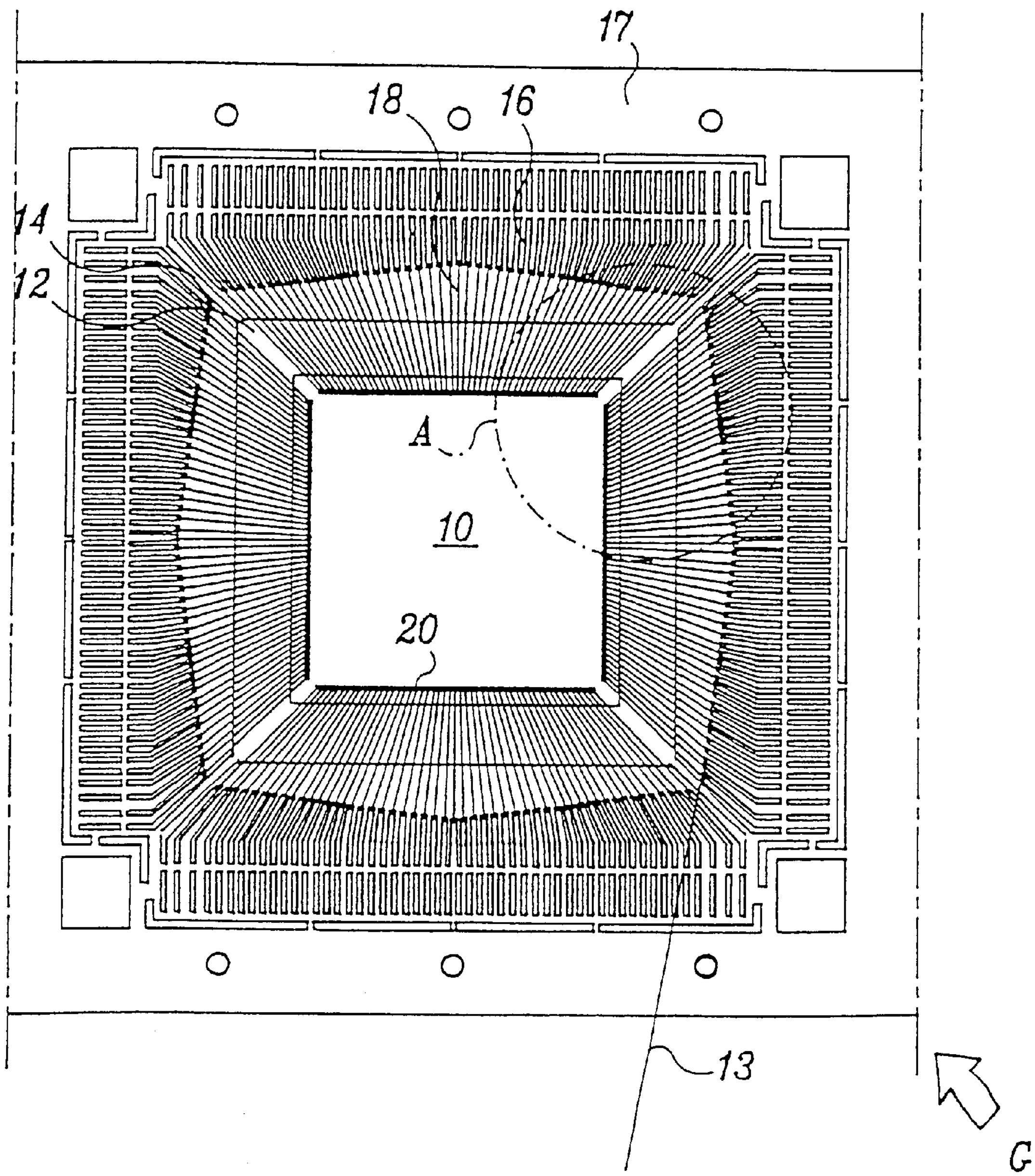
FIG. 1A is a plan view of a semiconductor integrated circuit device having a lead frame on which a conventional semiconductor chip is attached, according to the prior art.
Figure 1B:
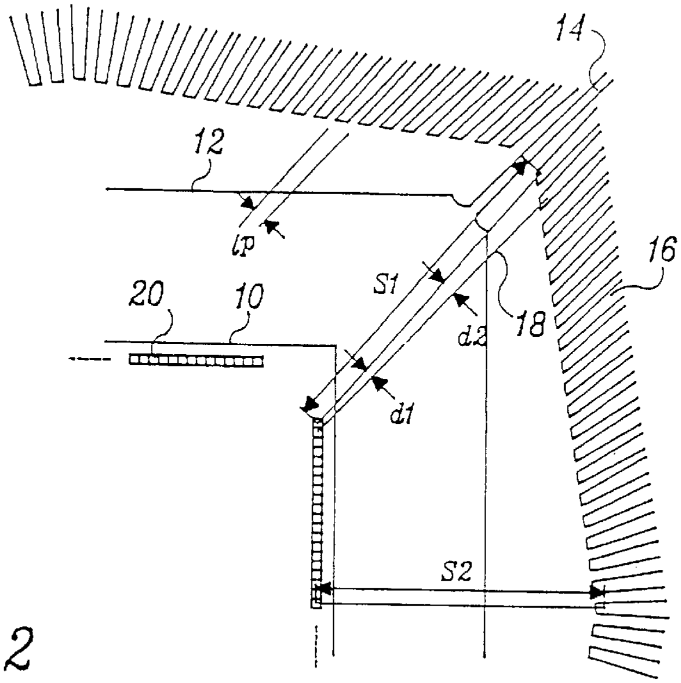
FIG. 1B is a detailed view of detail 'A' of FIG. 1A.
Figure 2:
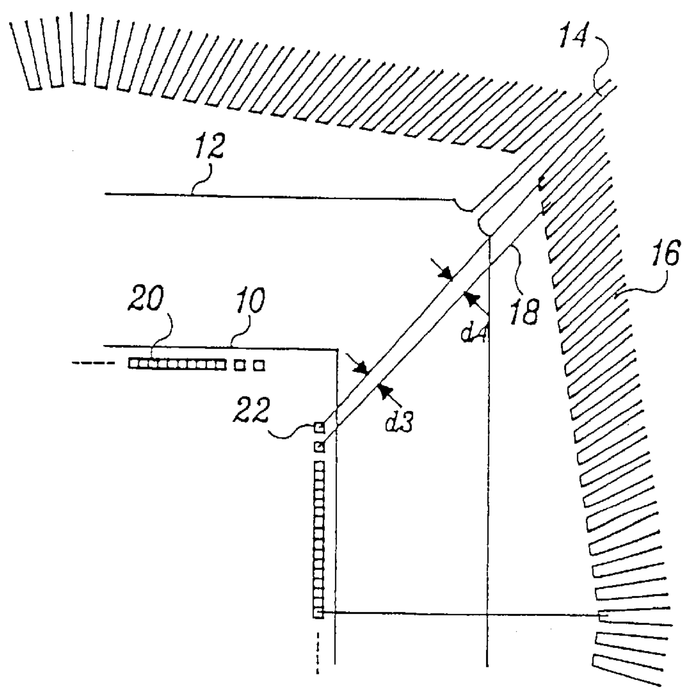
FIG. 2 is a partial plan view of a semiconductor integrated circuit device having a lead frame and a conventional semiconductor chip attached thereon having corner electrode pads with larger pad pitch, according to the prior art.

The following Table serves to illustrate the improvements of the present invention over the prior art structures. In Prior art 1, a semiconductor chip having a size of 4675 $\mu m^2$ and electrode pads of constant pad pitch of 75 μm is used, also having a lead frame with a lead count of 208 and a inner lead pitch of 200 μm. With reference to this Prior art 1, the increases in wire distances, resulting from the prior art improvements and the improvements of the present invention, are illustrated in the Table. In Prior art 2, two corner electrode pads (at each corner of each side) having a larger pad pitch of 120 μm are used, while Prior art 3 uses a corner pad pitch of 150 μm in the same general embodiment as shown in FIG. 2. Embodiments 1 to 4 show experimental results from application of the present invention. In Embodiment 1 and Embodiment 2, two corner electrode pads (at each corner of each side) are shifted toward the inside of the semiconductor chip by 35 μm and 70 μm, respectively, while maintaining the pad pitch constant, according to the embodiment depicted shown in FIGS. 3A and 3B. On the other hand, in Embodiment 3, an application of the embodiment shown in FIGS. 4A and 4B, the corner electrode pads are shifted inward by 35 μm and to have larger pad pitch of 120 μm. Finally, Embodiment 4 is representative of the invention embodiment in which the corner inner leads 216*a* are further extended toward the chip as shown in FIG. 6.

TABLE

| | | | | | Amount of increase | |
|---|---|---|---|---|---|---|
| | S1 (mil) | S2 (mil) | d2 (μm) | d1 (μm) | d2 (μm) | d1 (μm) |
| Prior Art 1 | 218 | 182 | 137 | 98 | — | — |
| Prior Art 2 | — | — | 151 | 120 | 14 | 22 |
| Prior Art 3 | — | — | 163 | 138 | 26 | 40 |
| Embodiment 1 | — | — | 152 | 118 | 15 | 20 |
| Embodiment 2 | — | — | 160 | 131 | 23 | 33 |
| Embodiment 3 | — | — | 166 | 142 | 29 | 44 |
| Embodiment 4 | 160 | 182 | — | — | — | — |

As explained in the foregoing specification and further illustrated in the foregoing table, the present invention makes it possible to increase the wire separation and reduce the wire span of the corner bonding wires in an IC device requiring dense arrangements of I/Os. The present invention thereby improves the reliability of the bonding wires, and enables the inclusion of more input and output connections for an IC device of a given size.

Although this invention has been described with reference to illustrative embodiments, the description should not be construed as limiting the disclosed invention. Various modifications and combinations of the illustrative embodiments, as well as other embodiments of this invention, will be apparent to persons skilled in the art upon reference to the description. Applicant claims, therefore, any and all embodiments or modifications falling within the spirit and scope of the appended claims.

What is claimed is:

1. A semiconductor integrated circuit device comprising:

a semiconductor chip having an active surface on which a plurality of electrode pads are formed, said active surface having four sides and four corners defined between adjacent sides, the plurality of electrode pads being arranged as a rectangular shape along the four sides of the active surface;

a lead frame having a die pad for supporting the semiconductor chip, inner leads electrically connected to the sides of the active surface, corner inner leads electrically connected to the sides of the active surface substantially near the corners of the active surface, and a plurality of bars electrically connected to respective corners of the die pad, said corner inner leads radially extending toward the four sides of the active surface away from the active area along a corner lead tip line, said inner leads radially extending toward the four sides of the active surface along an inner lead tip line, the corner inner leads being parallel with an adjacent tie bar, the inner leads not being parallel with the tie bars, the corner lead tip line tilting at a substantially non-parallel angle relative to a corresponding side of the active surface, and the inner lead tip line running substantially parallel with a corresponding side of the active surface; and a plurality of bonding wires connected between the plurality of electrode pads and the inner and corner inner leads, wherein the bonding wires connected between the corner inner leads and the corner electrode pads have substantially shorter lengths than the bonding wires connected between inner leads and electrode pads disposed in central regions of the sides of the active surface.

2. A lead frame for use in a semiconductor integrated circuit (IC) device for providing dense arrangements of input and output connections, the lead frame comprising:

(a) a body having a plurality of sides, a plurality of corners, and a center region;

(b) a die pad for supporting a semiconductor chip in the center region of the body;

(c) a plurality of tie bars connected to corners of the die pad;

(d) a plurality of inner leads, each having an inner end, extending radially inward from the periphery of the body in the direction of the die pad and extending at an non-parallel angle relative to the tie bars;

(e) an inner lead tip line defined by an imaginary line drawn through the inner ends of the inner leads, the inner lead tip line slanting inward toward the center region of the body, nearest to the center region near the corner;

(f) a plurality of corner inner leads, each having an inner end, the corner inner leads being in proximity with each corner and extending parallel with the adjacent tie bar, wherein the foremost corner one of the plurality of inner leads is substantially closer to the die pad than the others of the plurality of inner leads; and (g) a corner inner lead tip line defined by an imaginary line drawn through the inner ends of the corner inner leads, the corner inner lead tip line slanting inward toward the center region of the body, nearest to the center region near the corner, the corner inner lead tip line slanting inwardly further than the inner lead tip line.

3. A lead frame according to claim 2, in which the corner inner leads are parallel to each other.

4. A lead frame according to claim 2 wherein the plurality of tie bars attach the die pad to the lead frame in each corner.

* * * * *